United States Patent [19]

Rogers, Jr.

[11] Patent Number: 5,477,144
[45] Date of Patent: Dec. 19, 1995

[54] METHOD FOR REDUCING IMAGE ARTIFACTS IN MAGNETIC RESONANCE IMAGES ACQUIRED WITH SYNCHRONIZATION TO PHYSIOLOGICAL CYCLES

[75] Inventor: Walter J. Rogers, Jr., Ellicott City, Md.

[73] Assignee: Johns Hopkins University, Baltimore, Md.

[21] Appl. No.: 19,354

[22] Filed: Feb. 18, 1993

[51] Int. Cl.$^6$ ............................... G01V 3/00; G01V 5/00; G01V 7/00
[52] U.S. Cl. ........................... 324/309; 324/300; 324/307
[58] Field of Search ........................................ 324/300, 307, 324/309, 310, 311, 312, 313, 314, 318, 322; 128/653.2, 653.5

[56] References Cited

U.S. PATENT DOCUMENTS

| 4,720,678 | 1/1988 | Glover et al. | 324/309 |
|---|---|---|---|
| 4,812,760 | 3/1989 | Bottomley et al. | 324/309 |
| 5,031,624 | 7/1991 | Mistretta et al. | 128/653 |
| 5,138,259 | 8/1992 | Schmitt et al. | 324/309 |
| 5,159,550 | 10/1992 | Sakamoto et al. | 364/413.13 |

OTHER PUBLICATIONS

"Respiratory effects in two–dimensional Fourier transform MR imaging" *Radiology.* vol. 160. pp. 795–801, 1986.
"Respiratory ordered phase encoding (ROPE): A method for reducing respiratory motion artifacts in MR imaging" *J. Comput. Assist. Tomogr.* vol. 4, pp. 835–838, 1985.
"Practical aspects of ghosting in resistive nuclear magnetic resonance imaging systems" *Phys. Med. Biol.* vol. 31. pp. 721–735, 1986.
"The effect of motion in two–dimensional Fourier transformation magnetic resonance imaging" *Radiology* vol. 152. pp. 117–121, 1984.
"Quality assurance and image artifacts in Magnetic Resonance Imaging" published by Little, Brown and Company.

*Primary Examiner*—Sandra L. O'Shea
*Assistant Examiner*—Mack Haynes

[57] ABSTRACT

A method for removing image artifacts in MRI created when data acquisition is synchronized to a physiological and therefore uneven intervals. The method simultaneously records both image data from the MRI scanner as well as the exact interval between each data acquisition. The image data is then modified according to the timing file to create a image data file free from signal variations and artifacts resulting from the uneven data sampling intervals.

7 Claims, 4 Drawing Sheets

METHOD FOR REDUCING IMAGE ARTIFACTS IN MAGNETIC RESONANCE IMAGES ACQUIRED WITH SYNCHRONIZATION TO PHYSIOLOGICAL CYCLES

BACKGROUND OF THE INVENTION

1. Field of the Invention

This method relates to a method of improving the image quality in magnetic resonance images (MRI) when the timing of image acquisition is synchronized to a physiological cycle or interval. More particularly, there is a variation in the length of each cardiac cycle which produces a reduction in image quality in the final image. By measuring the cycle length associated with each data acquisition, the present processing method uses this information to correct the data. This results in improved image quality permitting improved visualization of anatomical structures.

2. Description of the Prior Art

Cardiac synchronized image acquisition is a standard method required in magnetic resonance imaging (MRI) to produce a clear image of the heart at specific phases of its cycle in order to assess the structure and/or function of the ventricles, atria, coronary arteries or great vessels. In addition, it is widely used to reduce blood flow artifacts in spine and abdominal imaging.

Uneven data sampling intervals (TR) between MRI data acquisitions exist in cardiac synchronized studies due to heart rate variability and produce artifacts indistinguishable from those caused by object motion. These are seen as smearing or object replication (ghosting) along one direction of the image matrix. Because the time between heart beats is not sufficiently long relative to the T1 relaxation constant of most tissue, the return of the magnetization vector to its equilibrium position (longitudinal recovery) is different for each data sampling. This results in a modulation of signal intensity along the phase direction in the pre-Fourier transformed magnitude data in turn produces reduced quality final images. A method to eliminate this form of image artifact would enhance the diagnostic value of heart cycle synchronized magnetic resonance images, but is not taught by the prior art.

U.S. Pat. Nos. 5,159,550 and 5,138,259 describe methods for MRI artifact suppression. However these patents address artifacts caused by object motion through the imaging plane and that of inhomogeneities in the static magnetic field respectively. Neither are directed toward the artifacts specific to heart cycle synchronized MRI, nor is the length of any physiological cycle used in the method of correction.

The following articles discuss various causes of MRI artifacts and present previous methods for reducing their negative impact on image quality;

1. "Respiratory effects in two-dimensional Fourier transform MR imaging" by L. Axel, R. M. Summers, H. Y. Kressel and C. Charles (Radiology vol. 160, p 795–801, (1986))
2. "Respiratory ordered phase encoding (ROPE): a method for reducing respiratory motion artefacts in MR imaging" by D. R. Bailes, D. J. Gilderdale, G. M. Bydder, A. G. Collins, and D. N. Firmin (J. Comput. Assist. Tomogr. vol.9, p835–838 (1985))
3. "Practical aspects of ghosting in resistive nuclear magnetic resonance imaging systems" by R. A. Lerski, K. Straughan and J. L. Williams (Phys. Med. Biol. vol. 31, p721–735 (1986))
4. "The effect of motion on two-dimensional Fourier transformation magnetic resonance imaging" by C. L. Schultz, R. J. Alfidi, D. Nelson, S. Y. Kopiwoda and M. E. Clampitt (Radiology vol. 152, p117–121 (1984))

The methods disclosed in these articles do not teach how to make use of the physiological cycle lengths associated with an image to correct the data and improve the image quality. Similarly, an article entitled "Practical aspects of ghosting in resistive nuclear magnetic resonance imaging systems" by R. A. Lerski, K. Williams, and J. L. Williams (vol.31 *Phys. Med. Biol.* (1986)) teaches that a modulation of the signal amplitude in the phase encoding direction (caused by electronics not physiology), will result in the production of image "ghosts" but does not disclose a method of data correction to overcome such a problem. Additionally, in chapter 3, page 25 and chapter 11, page 109 of the text *"Quality assurance and image artifacts in magnetic resonance imaging"* published by Little, Brown and Company, R. James Knowles and John Markisz teach that gating or synchronization of rf pulses (used in image formation) produce variable recovery times and thus modulate the T1 contrast of the image. They further teach that arrhythmias such as PVCs or changes in heart rate during the scan can reduce image quality. In neither case do they disclose the underlying effect of heart cycle variation on artifact formation nor disclose a correction.

SUMMARY OF THE INVENTION

The present invention is a method which reduces the magnetic resonance image artifacts associated with data acquisitions synchronized to a physiological cycle such as the cardiac cycle.

The MR image is produced by placing a suitable object in a strong magnetic field ($B_0$). This results in alignment of the protons within the object parallel to the ($B_0$) field. The signal used in image formation is produced by irradiation of the object with rf energy so as to "tip" the protons to an orientation either orthogonal or antiparallel to their equilibrium position. After the rf pulse, the protons return to the equilibrium state at a rate specific to different materials, and related to the strength of the magnetic ($B_0$) field. For most biological material, the time required for a 63% return to equilibrium, known as the T1 constant, is greater than 500 milliseconds. While the precessing protons are returning to equilibrium, and have a component in the orthogonal plane, a signal may be detected in a receiver coil by electrical induction. It is of importance to the present invention that maximal signal is only achieved from a material irradiated with rf energy at equilibrium or 5 T1's after a previous irradiation. In that the period between heart beats varies and does not permit complete return of the magnetization vector to the equilibrium state the resulting signal is modulated by this variation.

In order for a usable image to be produced from the acquired data, a 2D Fourier transform must be performed. Any modification of the signal intensity arising from the object under investigation will result in image degradation seen as blurring or production of displaced copies "ghosts" of the original image.

The relationship of signal (S) to variations in heart or other physiological cycle interval is described as:

$$Sa \frac{\exp(-TE/T2) \sin \psi \, Mo \, \{1 - 2\exp[-(TR - TE/2)/T1] + \exp(-TR/T1)\}}{[1 + \cos \psi \exp(-TR/T1)]} \quad (1)$$

WHERE:
TE=Time to echo
T2=Transverse relaxation time
ψ=Angle (radians) of alpha pulse
Mo=Original magnetization
TR=Repetition time between spin echo experiments or for gated scan the physiological interval, for example, in a heart gated scan the R—R interval would be used.
T1=Longitudinal relaxation time The present invention corrected for signal intensity modulation caused by heart rate variation as follows:
1. Simultaneous recording of the length of the heart or other appropriate cycle length associated with MRI data acquisition at each phase encoding position.
2. Normalization of the signal intensity for each phase encoding position in the image matrix to that which would have existed in the presence of a fixed cycle length as follows:

$$\text{Signal correction factor} = \text{Signal}_{mean}/\text{Signal}_{individual} \quad (2)$$

The signal predicted Signal (individual) for a given tissue for the observed physiological cycle interval is compared to the signal that would be predicted if all cycles were the same length (mean) during the scan period Signal (mean). To calculate the Signal (individual) equation (1) is used with the selected physiological interval occurring during that phase encoding position substituted for TR. Similarly, to calculate the Signal (mean) equation (1) is used with the mean physiological internal during the scan period substituted for TR. If the observed interval was longer than the mean, the signal value for that phase encoding position of the image matrix would be reduced according to the ratio in equation 2. If the observed interval was shorter than the mean, the signal value for that phase encoding position would be increased according to equation 2. (As used herein the phase encoding positions are columns (raster trajectory) of data stored in the image matrix, See FIG. 3, but may also take the trajectory of spiral or square spiral.)
3. After the acquired data has been corrected for the effect of cycle length variations, a standard Fourier transformation is applied along the X and Y image matrix dimensions to generate the spatial domain image that is used for diagnosis.

DETAILED DESCRIPTION OF THE PREFERRED EMBODIMENTS

Figure 1:
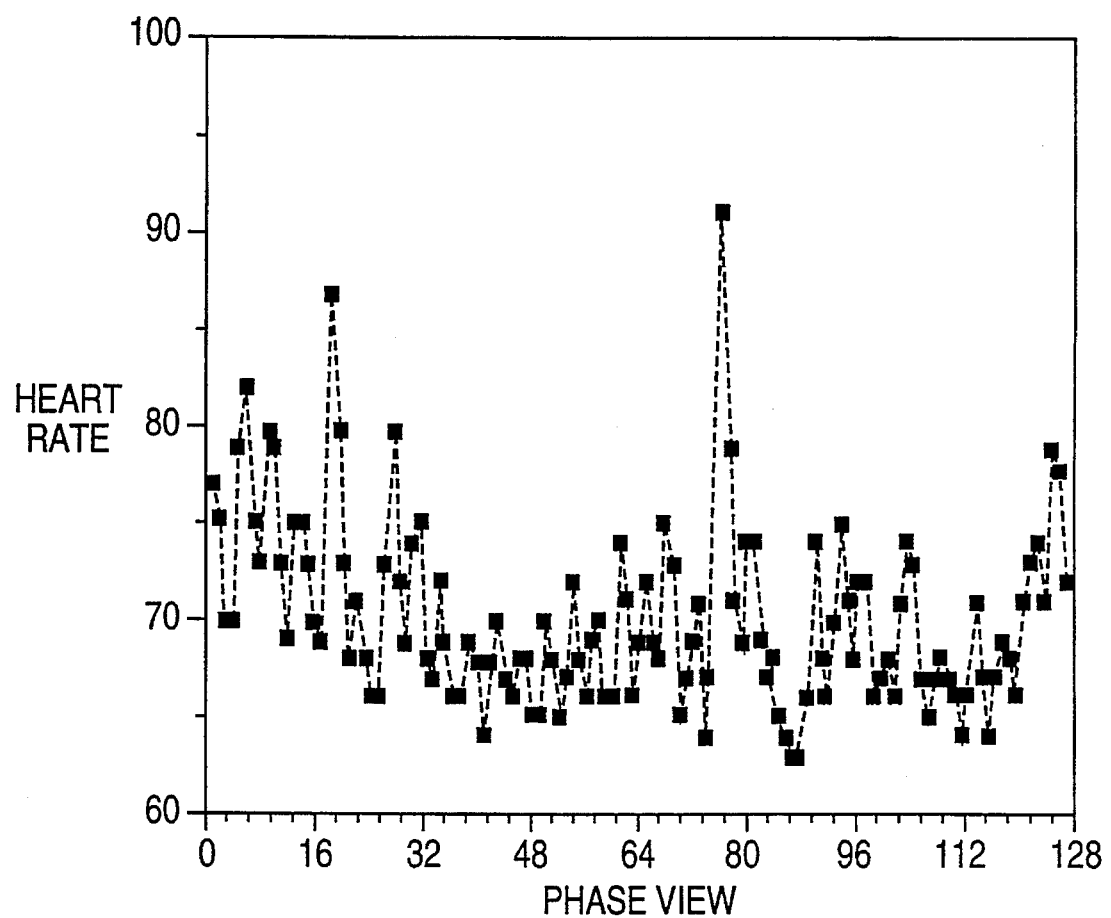
FIG. 1 displays the beat-by-beat variation in 128 consecutive heart cycles for a normal volunteer. Phase view (x-axis) refers to the portion of the data matrix to which each beat is associated.
Figure 2:
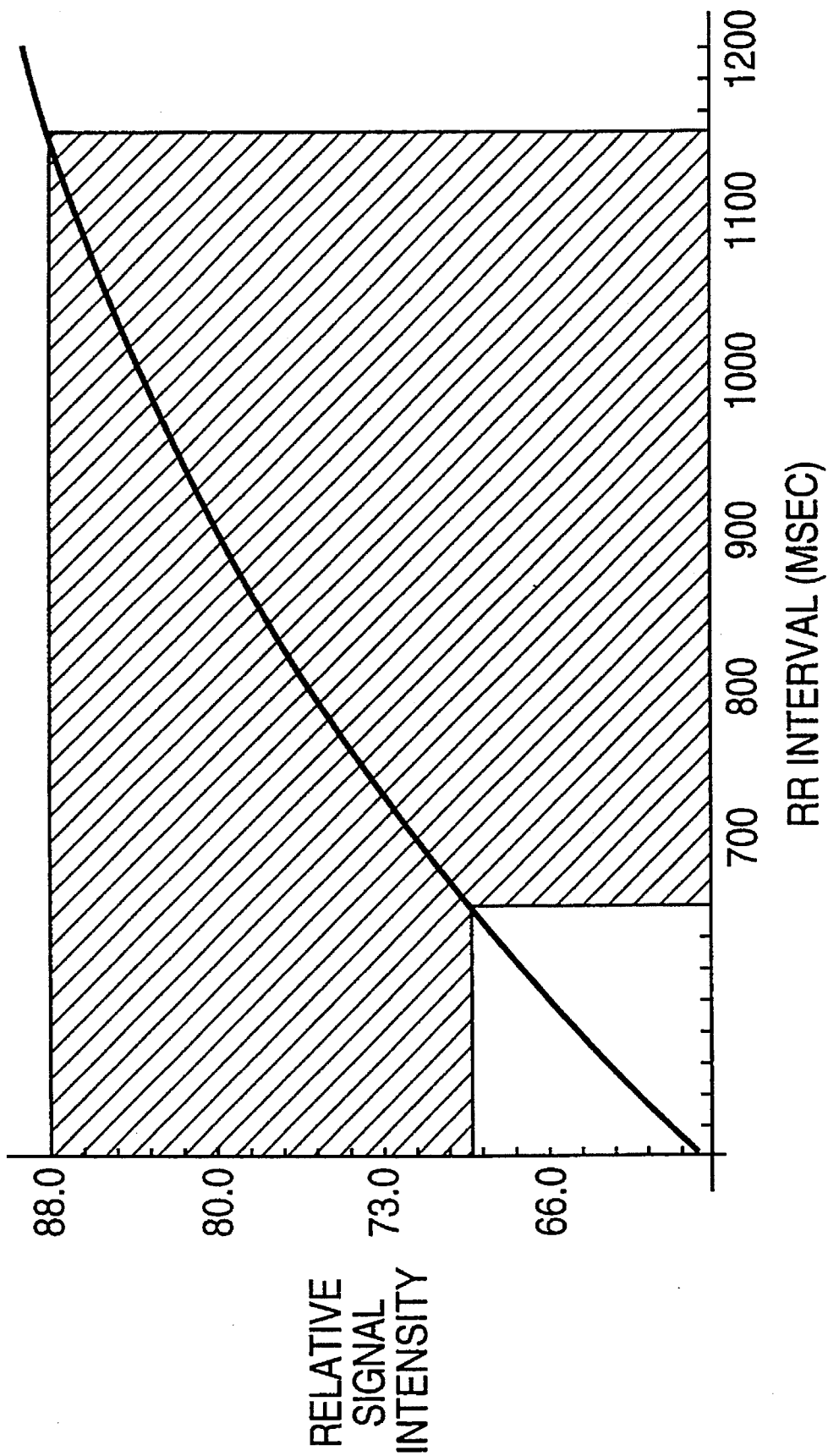
FIG. 2 shows the relationship between variations in the cycle length, to which data acquisition is synchronized, and the resulting variation in signal intensity. The shadded region delimits a typical heart rate range (RR interval) over 256 heart beats.

FIG. 1 plots the instantaneous heart rate sequentially for a group of 128 heart beats. There exists significant variation over time, some is random but, upon closer examination one can detect a pattern which corresponds to the subjects breathing pattern and has a frequency of about 0.4 Hz. In the majority of magnetic resonance images, data acquisition is not synchronized to a physiological process but to a fixed interval. As FIG. 2 shows, the rate by which the longitudinal magnetization returns to equilibrium in the majority of tissues is slow relative to the T1. Therefore complete return to equilibrium does not occur. If the data sampling interval is fixed a steady state condition is established and the resulting signal is without physiological modulation. However, in physiologically synchronized MRI the TR interval varies. When the sampling interval is not constant and occurs at such a rate which does not allow complete longitudinal relaxation of the magnetization within the tissues under examination, an image artifact will occur.

By image artifact is meant any artificial or extraneous feature introduced into the image. Because artifacts, as they are described in the present invention, are caused by signal modulation as one moves from phase view to phase view, the artifacts are also propagated along the phase encoding direction in the final image. Artifacts can take the form of well defined copies or "ghosts" of the true object linearly displaced along the phase encoding direction. More often artifacts take the form of local blurring of the edges within the true image or a smearing of signal along the phase direction.

Image artifacts resulting from object motion caused by respiration, blood flow, or gross motion have been well documented and represent a significant source of reduced image quality. Methods of reducing these artifacts include synchronization or gating to the motion as well as modification of the order in which the individual phase lines are acquired. However these methods do not address nor do they correct for the specific artifact described in the present invention. Anything that modifies the signal intensity of the object data during the acquisition period, will result in image artifacts. The vast majority of artifacts are seen to occur along the phase encoding direction. This is due to the difference in the rate at which frequency and phase data are acquired. While the frequency encoding occurs over a period of a few milliseconds, complete phase encoding requires the entire data acquisition period requiring from seconds to minutes. Therefore, while the speed of frequency encoding produces an undistorted representation of the underlying data, the duration of the phase encoding process is sensitive to motions such blood flow, respiration, voluntary and involuntary subject movement, machine instabilities ($B_0$ field, Rf amplifier, or gradient amplifier) and to variations in the sampling interval with its attendant modulation or distortion of acquired object signal intensity.

Figure 3:
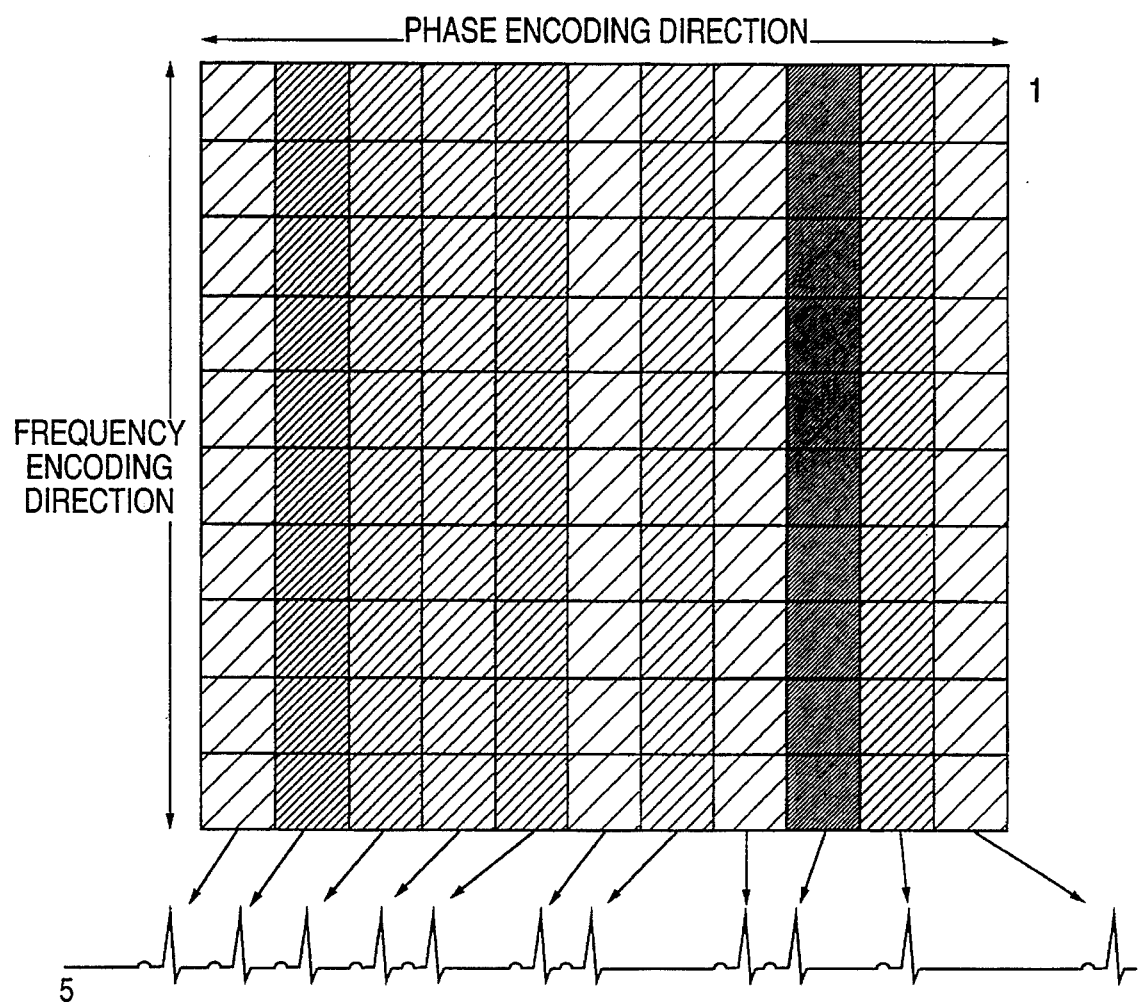
FIG. 3 shows the relationship between the length of the RR interval and the signal intensity of the data that is stored in the image matrix.

FIG. 3 simulates the effect of variations in heart rate during the scan period on the signal contained in the data matrix. The object under investigation will contribute to signal in the matrix based on proton density and distribution. Modulation of this signal due to heart rate variation will produce artifacts and degrade image quality and diagnostic power.

The present invention discloses that if the timing of each physiological event used for MRI synchronization is stored, along with the associated phase view data, the contribution of the signal variation effect can be determined and removed from the data prior to reconstruction into the final image and prior to the creation of the associated artifacts. The rate at which the magnetic equilibrium is re-established after a perturbation is an exponential function dependent on the materials T1 value and therefore indirectly related to the strength of the magnetic in which the resonance experiment is occurring.
This relationship is described by:

$$M_z(\tau) = M_\infty [1 - \exp(-\tau/T1)] \quad (3)$$

where $M_z(\tau)$ is the magnetization in the z-direction after time period ($\tau$) from being maximally perturbed by an 180 degree inversion.

$M_\infty$ is the magnetization equilibrium value.

T1 is the recovery rate for a specific material.

$\tau$ is the delay from perturbation to calculation of $M_z$.

The total signal available from the material to be used in formation of an image is also related to the $T_{2*}$ or transverse relaxation rate. This rate is described by:

$$1/T_2^* = 1/T2 + \gamma \Delta B_0/2 \quad (4)$$

Where $T_2^*$ is the transverse decay constant including contributions from magnetic field inhomogeneity.

$\gamma$ is the magnetogyric ratio for the nucleus under investigation.

$\Delta B_0$ is the magnetic field inhomogeneity.
By application of these relationships, the present method can predict the signal produced after any interval (TR) given the materials T1 and T2, the TE of applied pulse sequence and correct for the effect of irregular sampling intervals. Measurement of the individual physiological intervals may be accomplished in any suitable manner. Including but not limited to: (1) capturing the analog physiological signal and processing the data to produce a file with a physiological interval for each data acquisition. (2) Directly creating an interval file on the MRI scanners computer associated with the time between each data acquisition using an internal clock and associated software instructions.

Physiological processes that would be suitable for synchronization by an MRI scanner are any that fully or partially occur within the period of dynamic relaxation of nuclear magnetization to equilibrium. This would include but not be limited to: The cardiac cycle in which its periodicity could be measured by any suitable means including but not limited to: signals produced from an electrocardiogram, signals from a pressure transducer, signals from an acoustic microphone, signals from a piezoelectric crystal transducer; The respiratory cycle as measured by methods including but not limited to signals generated by strain gauges, signals produced by changes in the Rf coil signal as its geometry is changed during the respiratory cycle, signals from meters which measure air flow from either the mouth or the nose. Motion (articulation) of joints as measured by strain gauges, dv/dt meters or other position detecting devices may also be used.

Figure 4:
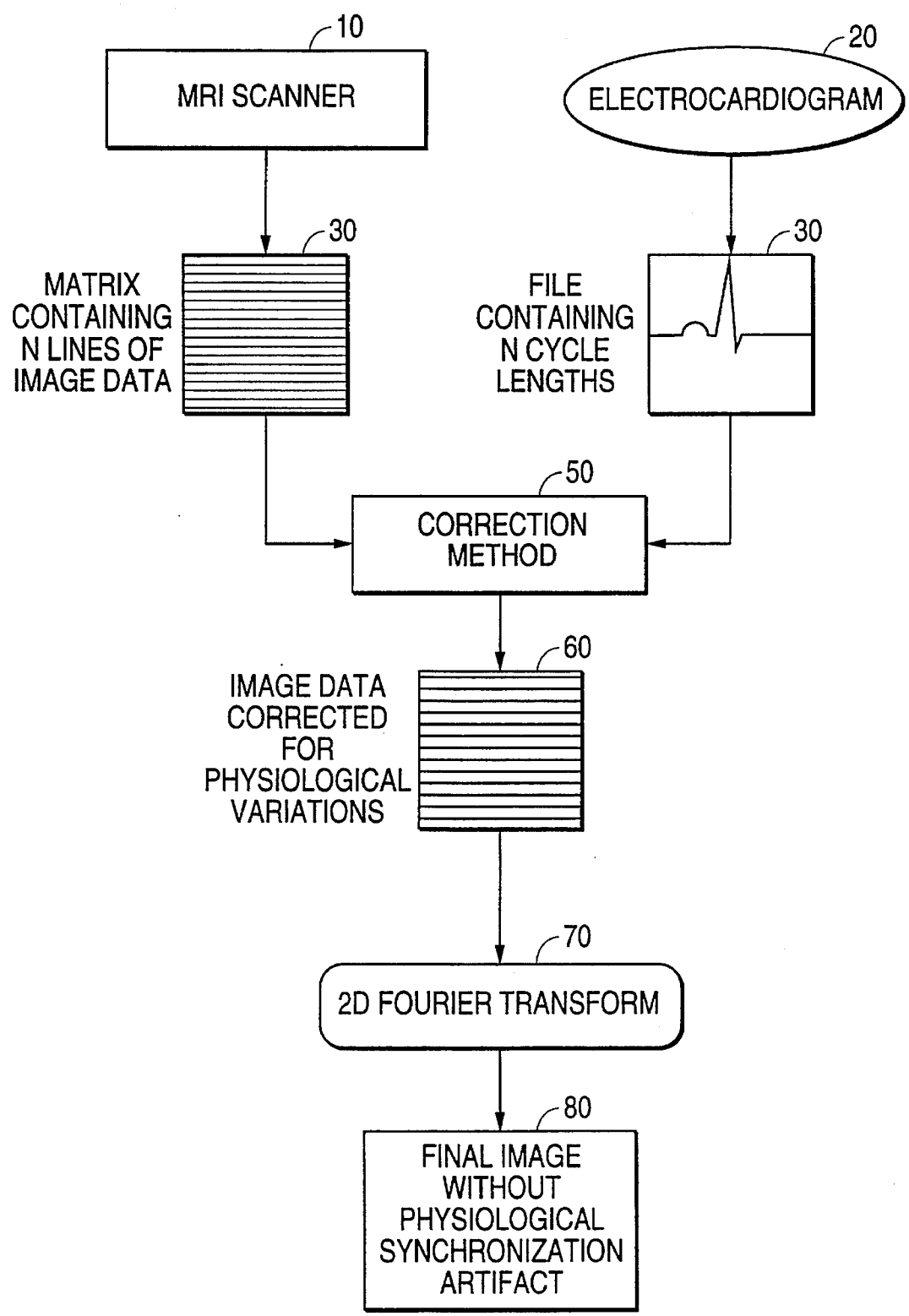
FIG. 4 displays a flow diagram of the signal correction method of the present method utilizing the cycle lengths associated with each phase encoding data acquisition step.

FIG. 4 shows the process by which the image data and interval file are used to produce a new, corrected pre-Fourier transformation image data file. The MRI scanner (10) produces a physiologically synchronized, 2-dimensional image matrix in the frequency domain which contains valid information about the object of interest. The signal intensity of this data is modulated along the phase encoding direction according to the length of each data collection interval. At the same time that this data is collected the intervals of the synchronizing physiological process (20) is recorded and stored in an appropriate form. The intervals are then analyzed to determine a representative interval length. This may be either mean or median. Using equation (1), the signal produced by the object of interest is calculated using appropriate values for T1, T2, TE and the representative interval as a TR. To calculate the Signal (individual) equation (1) is used with the selected physiological interval occurring during that phase encoding position substituted for TR. Similarly, to calculate the Signal (mean) equation (1) is used with the mean physiological internal during the scan period substituted for TR. Using equation (2), a signal correction factor was determined for each phase encoding position. The correction factor (50) was multiplied times the voxel signal value in the image. All pixels frequency encoded during a single phase encoding step (i.e. phase encoding position) were individually multiplied by the same correction value. This process was repeated for the voxels associated with each phase encoding position using the appropriate correction factor.

The MRI data matrix (30) could be filled by any appropriate means including but not limited to: the spin-echo technique, the gradient recalled echo technique, the echoplanar method, the "turbo-flash" method or any other method used to produce an magnetic resonance image that is synchronized to a physiological process.

What is claimed is:

1. A method for removing artifacts in MRI, comprising the steps of:

recording duration of a particular physiological cycle occurring between each phase encoding increment through image space; and, normalizing observed MRI signal intensity associated with each phase encoding increment to a calculated value in which a single repetition time (TR) value is used for the calculation of MRI signal intensity at every phase encoding increment.

2. The method of claim 1, wherein the normalization step uses the mean duration of physiological cycles recorded during image formation as the single repetition time (TR) value.

3. The method of claim 1, wherein the particular physiological cycle is the heart cycle.

4. The method of claim 1, wherein phase encoding is performed using a raster k-space trajectory acquiring one line of k-space with each TR interval.

5. The method of claim 1, wherein the phase encoding is performed using a raster k-space trajectory acquiring more than one line of k-space with each TR interval.

6. The method of claim 1, wherein the phase encoding is performed using a spiral k-space trajectory.

7. The method of claim 1, wherein the phase encoding is performed using an echo planar imaging technique.

* * * * *

UNITED STATES PATENT AND TRADEMARK OFFICE
CERTIFICATE OF CORRECTION

PATENT NO. : 5,477,144
DATED : December 19, 1995
INVENTOR(S) : Walter J. Rogers

It is certified that error appears in the above-indentified patent and that said Letters Patent is hereby corrected as shown below:

In column 1 at line 6, please insert:

-- This invention was made with government support under Grant No. HL 17655 awarded by the National Institutes of Health. The government has certain rights in this invention. --

Signed and Sealed this

Eighteenth Day of June, 1996

*Attest:*

BRUCE LEHMAN

*Attesting Officer*     *Commissioner of Patents and Trademarks*